(12) United States Patent
Hollingshead et al.

(10) Patent No.: US 8,244,507 B2
(45) Date of Patent: Aug. 14, 2012

(54) METHOD AND APPARATUS FOR DERIVING ASSOCIATIONS BETWEEN PARTS AND FASTENERS

(75) Inventors: Paul Charles Hollingshead, Florissant, MO (US); Mark David Shirley, Saint Charles, MO (US)

(73) Assignee: The Boeing Company, Chicago, IL (US)

( * ) Notice: Subject to any disclaimer, the term of this patent is extended or adjusted under 35 U.S.C. 154(b) by 1080 days.

(21) Appl. No.: 12/265,344

(22) Filed: Nov. 5, 2008

(65) Prior Publication Data

US 2010/0114536 A1 May 6, 2010

(51) Int. Cl.
*G06F 9/455* (2006.01)
(52) U.S. Cl. .......................................................... 703/7
(58) Field of Classification Search .................. 703/1, 6, 703/7; 700/104, 179, 98, 97; 345/420, 629; 709/203; 715/825; 382/154, 203; 428/304.4; 702/167; 408/67; 29/428; 324/754
See application file for complete search history.

(56) References Cited

U.S. PATENT DOCUMENTS

| | | | |
|---|---|---|---|
| 5,341,461 A * | 8/1994 | Kikuchi et al. | 345/420 |
| 7,195,429 B2 * | 3/2007 | Dods et al. | 408/67 |
| 7,353,609 B2 | 4/2008 | Hollingshead et al. | |
| 7,398,129 B2 * | 7/2008 | Ishii et al. | 700/104 |
| 7,499,845 B1 * | 3/2009 | Quincy et al. | 703/7 |
| 7,596,468 B2 * | 9/2009 | Chang et al. | 702/167 |
| 8,027,745 B1 * | 9/2011 | Freeze | 700/106 |
| 2003/0033041 A1 * | 2/2003 | Richey | 700/98 |
| 2003/0171841 A1 * | 9/2003 | Porter et al. | 700/179 |
| 2004/0055130 A1 * | 3/2004 | Scott et al. | 29/428 |
| 2005/0055181 A1 | 3/2005 | Verdura et al. | |
| 2005/0073520 A1 | 4/2005 | Papakipos et al. | |
| 2005/0084344 A1 | 4/2005 | Dods et al. | |
| 2005/0102050 A1 * | 5/2005 | Richey | 700/97 |
| 2005/0172470 A1 | 8/2005 | Cobb et al. | |
| 2005/0288909 A1 * | 12/2005 | Mikulecky | 703/1 |
| 2006/0250421 A1 * | 11/2006 | Anderson et al. | 345/629 |
| 2007/0150243 A1 * | 6/2007 | Nagase | 703/6 |
| 2007/0160823 A1 * | 7/2007 | Pyzik et al. | 428/304.4 |
| 2007/0188490 A1 | 8/2007 | Kanai et al. | |
| 2008/0222568 A1 * | 9/2008 | Okuwaki et al. | 715/825 |
| 2008/0255809 A1 * | 10/2008 | Ran et al. | 703/1 |
| 2009/0049377 A1 | 2/2009 | Moore | |
| 2009/0060347 A1 * | 3/2009 | Kageura | 382/203 |
| 2009/0112973 A1 * | 4/2009 | Kessel et al. | 709/203 |
| 2009/0115439 A1 * | 5/2009 | Saunders et al. | 324/754 |
| 2009/0116728 A1 * | 5/2009 | Agrawal et al. | 382/154 |
| 2009/0174709 A1 * | 7/2009 | Kozlak et al. | 345/420 |
| 2009/0187264 A1 * | 7/2009 | Hashimoto et al. | 700/98 |

(Continued)

OTHER PUBLICATIONS

Office Action issued on Jun. 27, 2011 for U.S. Appl. No. 12/265,323.

(Continued)

*Primary Examiner* — Kandasamy Thangavelu
(74) *Attorney, Agent, or Firm* — Yee & Associates, P.C.

(57) ABSTRACT

A method, apparatus, and computer program product for identifying associations in a model of a structure. A number of fastener locations is identified in the model of the structure. A line segment extends through each of the number of fastener locations to form a number of line segments. The line segment extends a selected distance away from an associated fastener location in the number of fastener locations. A number of parts is identified through which the line segment extends to form a number of identified parts for a fastener for each of the number of line segments.

22 Claims, 11 Drawing Sheets

U.S. PATENT DOCUMENTS

2009/0259440 A1* 10/2009 Reed et al. .................. 703/1
2009/0289391 A1 11/2009 Tye et al.
2010/0085357 A1* 4/2010 Sullivan et al. ............... 345/420

OTHER PUBLICATIONS

U.S. Appl. No. 12/265,323, filed Nov. 5, 2008, Hollingshead et al.

* cited by examiner

FIG. 8

| FASTENER ID | PIERCED1 | PIERCED2 | PIERCED3 | SURFACE ID |
|---|---|---|---|---|
| HLP_0100 | SKIN | FORMER | | s:a, s:d, f:a, f:b |
| HLP_0101 | SKIN | FORMER | | s:a, s:d, f:a, f:b |
| HLP_0102 | SKIN | FORMER | | s:a, s:d, f:a, f:b |
| HLP_0103 | SKIN | FORMER | | s:a, s:d, f:a, f:b |
| HLP_0104 | SKIN | FORMER | | s:a, s:d, f:a, f:b |
| HLP_0105 | SKIN | FORMER | | s:a, s:d, f:a, f:b |
| HLP_0106 | SKIN | SPLICE STRAP | FORMER | s:a, s:d, ss:a, ss:b, f:a, f:b |
| HLP_0107 | SKIN | SPLICE STRAP | FORMER | s:a, s:d, ss:a, ss:b, f:a, f:b |
| HLP_0108 | SKIN | FORMER | | s:a, s:d, f:a, f:b |
| HLP_0109 | SKIN | FORMER | | s:a, s:d, f:a, f:b |
| HLP_0110 | SKIN | FORMER | | s:a, s:d, f:a, f:b |
| HLP_0111 | SKIN | FORMER | | s:a, s:d, f:a, f:b |
| HLP_0112 | SKIN | FORMER | | s:a, s:d, f:a, f:b |
| HLP_0113 | SKIN | FORMER | | s:a, s:d, f:a, f:b |
| HLP_0114 | SKIN | FORMER | | s:a, s:d, f:a, f:b |
| HLP_0115 | SKIN | FORMER | | s:a, s:d, f:a, f:b |
| HLP_0180 | INTERCOSTAL | FORMER | | i:b, i:a, f:l, f:m |
| HLP_0181 | INTERCOSTAL | FORMER | | i:b, i:a, f:l, f:m |
| HLP_0300 | SKIN | SPLICE STRAP | INTERCOSTAL | s:a, s:d, ss:a, ss:b, i:e, i:f |
| HLP_0301 | SKIN | INTERCOSTAL | | s:a, s:d, i:c, i:d |
| HLP_0302 | SKIN | INTERCOSTAL | | s:a, s:d, i:c, i:d |
| HLP_0303 | SKIN | INTERCOSTAL | | s:a, s:d, i:c, i:d |

| LOCATION | GAP | |
|---|---|---|
| 1 | NI | |
| 2 | NI | |
| 3 | NI | |
| 4 | NI | |
| 5 | -0.0071 | 0.0071 |
| 6 | -0.0054 | 0.0054 |
| 7 | -0.0038 | 0.0038 |
| 8 | -0.0023 | 0.0023 |
| 9 | -0.0015 | 0.0015 |
| 10 | 0.0003 | 0.0003 |
| 11 | 0.0011 | 0.0011 |
| 12 | 0.0002 | 0.0002 |
| 13 | 0.0008 | 0.0008 |
| 14 | 0.0015 | 0.0015 |
| 15 | 0.0021 | 0.0021 |
| RANGE | 0.0092 | 0.0069 |
| MEDIAN | 0.0002 | 0.0015 |

METHOD AND APPARATUS FOR DERIVING ASSOCIATIONS BETWEEN PARTS AND FASTENERS

CROSS REFERENCE TO RELATED APPLICATION

The present invention is related to the following patent application entitled "Method and Apparatus for Identifying Gaps between Parts", Ser. No. 12/265,323, filed even date hereof, assigned to the same assignee, and incorporated herein by reference.

BACKGROUND INFORMATION

1. Field

The present disclosure relates generally to an improved data processing system and, in particular, to a method and apparatus for processing data. Still more particularly, the present disclosure relates to a method, apparatus, and computer program product for deriving associations between parts and fasteners in a model of an object.

2. Background

Computer aided design involves the use of computers or other data processing systems to aid in the design of an object. These data processing systems may include two-dimensional vector based drafting programs and three-dimensional solid and surface modeling programs. Computer aided design programs are commonly used in aerospace manufacturing to design and produce various objects such as, for example, aircraft, space vehicles, aircraft engines, tools, buildings, medical devices, fuel tanks, and other suitable objects.

These types of systems are typically used for detailed engineering of three-dimensional and/or two-dimensional models of objects. These models include information used to create drawings of the objects. These drawings may be, for example, two-dimensional and/or three-dimensional drawings. The models also may contain information about parts in the objects. The information may include, for example, dimensions, materials, processing notes, product identifications, and other suitable information.

Computer aided design programs allow designers or engineers to lay out and develop various models for objects on a display device. The information in the models, however, is not well organized. Typically, information may be associated with the particular components or parts in a model. Relationships, however, between those parts and other parts are typically not present.

Currently, when information about parts in a model is needed, a user is required to go through the model to identify the needed information. In some cases, the needed information may not be present in the model. The user may then be required to create the desired information based on a review of the information present in the model.

Therefore, it would be advantageous to have a method, apparatus, and computer program product that overcomes the issues described above.

SUMMARY

In one advantageous embodiment, a method is present for identifying associations in a model of a structure. A number of fastener locations is identified in the model of the structure. A line segment extends through each of the number of fastener locations to form a number of line segments. The line segment extends a selected distance away from an associated fastener location in the number of fastener locations. A number of parts is identified through which the line segment extends to form a number of identified parts for a fastener for each of the number of line segments.

In another advantageous embodiment, a data processing system comprises a bus, a communications unit, a storage device, a processor unit connected to the bus, and program code. The processor unit executes the program code to identify a number of fastener locations in a model of a structure. The processor unit executes the program code to extend a line segment through each of the number of fastener locations to form a number of line segments. The line segment extends a selected distance away from an associated fastener location in the number of fastener locations. The processor unit executes the program code to identify a number of parts through which the line segment extends to form a number of identified parts for a fastener for each of the number of line segments.

In another advantageous embodiment, a computer program product is present for identifying associations in a model of a structure. The computer program product comprises a computer recordable storage medium and program code stored on the computer recordable storage medium. Program code is present for identifying a number of fastener locations in the model of the structure. Program code is present for extending a line segment through each of the number of fastener locations to form a number of line segments, wherein the line segment extends a selected distance away from an associated fastener location in the number of fastener locations. Program code is also present for identifying a number of parts through which the line segment extends to form a number of identified parts for a fastener for each of the number of line segments.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

FIG. 8 is a diagram illustrating associations in a model in accordance with an advantageous embodiment;

DETAILED DESCRIPTION

Figure 1:
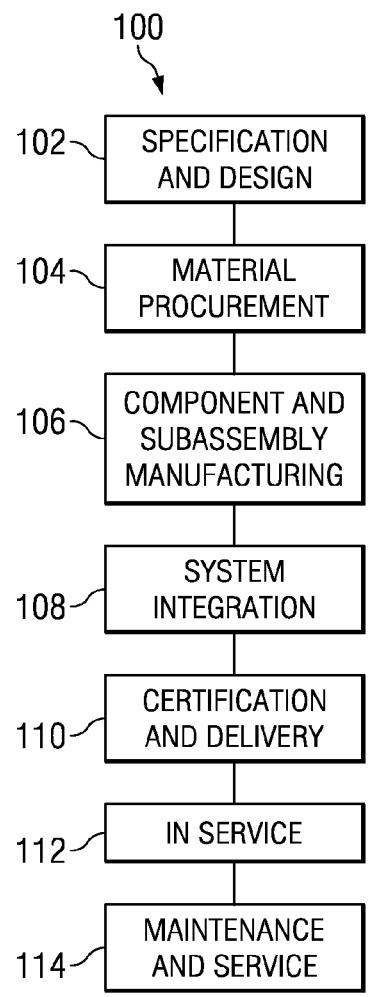
FIG. 1 is a diagram illustrating an aircraft manufacturing and service method in accordance with an advantageous embodiment.
Figure 2:
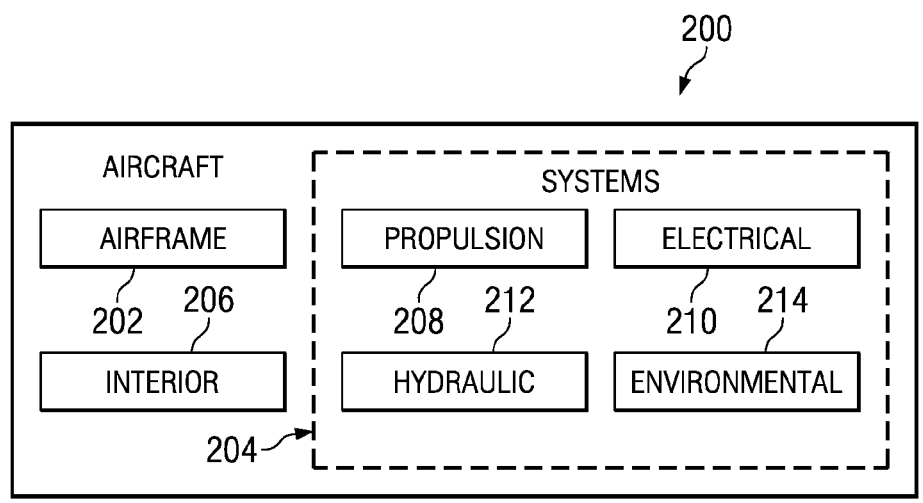
FIG. 2 is a diagram of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, a diagram illustrating an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, a diagram of an aircraft is depicted in which an advantageous embodiment may be implemented. The different advantageous embodiments may be used in the design of aircraft 200 and/or structures for aircraft 200. In this example, aircraft 200 is produced by aircraft manufacturing and service method 100 in FIG. 1 and may include airframe 202 with a plurality of systems 204 and interior 206.

Examples of systems 204 include one or more of propulsion system 208, electrical system 210, hydraulic system 212, and environmental system 214. Any number of other systems may be included. Although an aerospace example is shown, different advantageous embodiments may be applied to other industries, such as the automotive industry. Apparatus and methods embodied herein may be employed during any one or more of the stages of aircraft manufacturing and service method 100 in FIG. 1.

In one illustrative example, different advantageous embodiments may be used during specification and design 102 in FIG. 1 of aircraft 200. In particular, the different advantageous embodiments may be applied to identifying fastener and gap data during specification and design 102 in FIG. 1. Further, some advantageous embodiments also may be applied during maintenance and service 114 in FIG. 1 to design replacement parts and/or configuration changes to aircraft 200.

Figure 3:
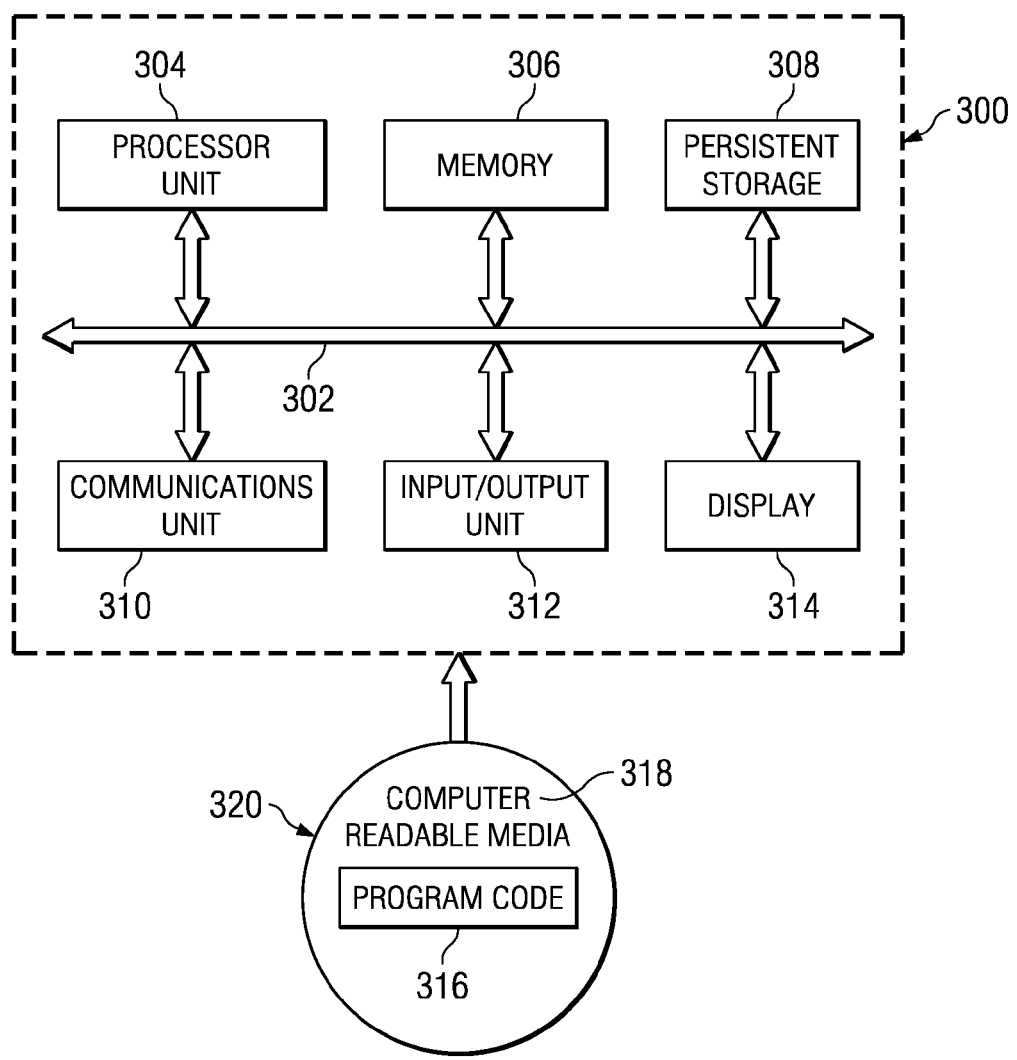
FIG. 3 is a diagram of a data processing system in accordance with an illustrative embodiment.

Turning now to FIG. 3, a diagram of a data processing system is depicted in accordance with an illustrative embodiment. Data processing system 300 is an example of a data processing system that may be used to analyze models to identify fasteners and/or gaps between parts. In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a set of one or more processors or may be a multi-processor core, depending on the particular implementation. Further, processor unit 304 may be implemented using one or more heterogeneous processor systems in which a main processor is present with secondary processors on a single chip. As another illustrative example, processor unit 304 may be a symmetric multi-processor system containing multiple processors of the same type.

Memory 306 and persistent storage 308 are examples of storage devices. A storage device is any piece of hardware that is capable of storing information either on a temporary basis and/or a permanent basis. Memory 306, in these examples, may be, for example, a random access memory or any other suitable volatile or non-volatile storage device.

Persistent storage 308 may take various forms depending on the particular implementation. For example, persistent storage 308 may contain one or more components or devices. For example, persistent storage 308 may be a hard drive, a flash memory, a rewritable optical disk, a rewritable magnetic tape, or some combination of the above. The media used by persistent storage 308 also may be removable. For example, a removable hard drive may be used for persistent storage 308.

Communications unit 310, in these examples, provides for communications with other data processing systems or devices. In these examples, communications unit 310 is a network interface card. Communications unit 310 may provide communications through the use of either or both physical and wireless communications links.

Input/output unit 312 allows for input and output of data with other devices that may be connected to data processing system 300. For example, input/output unit 312 may provide a connection for user input through a keyboard and mouse. Further, input/output unit 312 may send output to a printer. Display 314 provides a mechanism to display information to a user.

Instructions for the operating system and applications or programs are located on persistent storage 308. These instructions may be loaded into memory 306 for execution by processor unit 304. The processes of the different embodiments may be performed by processor unit 304 using computer implemented instructions, which may be located in a memory, such as memory 306. These instructions are referred to as program code, computer usable program code, or computer readable program code that may be read and executed by a processor in processor unit 304. The program code in the different embodiments may be embodied on different physical or tangible computer readable media, such as memory 306 or persistent storage 308.

Program code 316 is located in a functional form on computer readable media 318 that is selectively removable and may be loaded onto or transferred to data processing system 300 for execution by processor unit 304. Program code 316 and computer readable media 318 form computer program product 320 in these examples. In one example, computer readable media 318 may be in a tangible form such as, for example, an optical or magnetic disc that is inserted or placed into a drive or other device that is part of persistent storage 308 for transfer onto a storage device, such as a hard drive that is part of persistent storage 308.

In a tangible form, computer readable media 318 also may take the form of a persistent storage, such as a hard drive, a thumb drive, or a flash memory that is connected to data processing system 300. The tangible form of computer readable media 318 is also referred to as computer recordable storage media. In some instances, computer readable media 318 may not be removable.

Alternatively, program code 316 may be transferred to data processing system 300 from computer readable media 318 through a communications link to communications unit 310 and/or through a connection to input/output unit 312. The communications link and/or the connection may be physical or wireless in the illustrative examples. The computer readable media also may take the form of non-tangible media, such as communications links or wireless transmissions containing the program code.

In some illustrative embodiments, program code 316 may be downloaded over a network to persistent storage 308 from another device or data processing system for use within data processing system 300. For instance, program code stored in a computer readable storage medium in a server data processing system may be downloaded over a network from the server to data processing system 300. The data processing system providing program code 316 may be a server computer, a client computer, or some other device capable of storing and transmitting program code 316.

The different components illustrated for data processing system 300 are not meant to provide architectural limitations to the manner in which different embodiments may be implemented. The different illustrative embodiments may be implemented in a data processing system including components in addition to or in place of those illustrated for data processing system 300. Other components shown in FIG. 3 can be varied from the illustrative examples shown.

The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 300 is any hardware apparatus that may store data. Memory 306, persistent storage 308, and computer readable media 318 are examples of storage devices in a tangible form.

In another example, a bus system may be used to implement communications fabric 302 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 306 or a cache such as that found in an interface and memory controller hub that may be present in communications fabric 302.

The different advantageous embodiments recognize that some information that may be desirable in designing objects may include information about fasteners and parts that may be attached to each other using fasteners. The different advantageous embodiments recognize that this type of information may be useful for identifying appropriate fasteners for securing or attaching parts to each other.

For example, the different advantageous embodiments recognize that parameters, such as a fastener length, a diameter, a grip length, and other suitable parameters may depend on the parts to be attached to each other. The different advantageous embodiments also recognize that identification of locations for fasteners and the parts to be attached to each other by those fasteners may be useful in verifying what fasteners should be used.

As another example, the different advantageous embodiments recognize that a list of fasteners may be useful when a specific manufacturing sequence involving specific parts are present. As yet another example, the different advantageous embodiments recognize that a list of fasteners and associated parts may be useful when structural repairs involve specific parts. Identification of fasteners also may be useful for a retrofit or modification of an aircraft.

The different advantageous embodiments recognize that this information about fasteners may not be available in a model. For example, some advantageous embodiments may not contain fasteners. Instead, the different advantageous embodiments recognize that these models may include pierce points. These pierce points may be locations where fasteners should be placed. As a result, the different advantageous embodiments recognize that a user is unable to search for information about fasteners because fasteners are not yet present in the model.

Thus, the different advantageous embodiments provide a method, apparatus, and computer program product for identifying associations in a model of a structure. In the different advantageous embodiments, a number of fastener locations in the model of the structure are identified. A number, as used herein, when referring to items, means one or more items. For example, a number of fastener locations is one or more fastener locations.

A line segment is extended through each of the number of fastener locations to form a number of line segments. The line segment extends a selected distance outside of an associated fastener location in the number of fastener locations. A number of parts is then identified through which the line segment extends to form a number of identified parts for a fastener for each of the number of line segments.

In this manner, a list or collection of information identifying fasteners and parts associated with the fasteners may be identified. Parts associated with a fastener in these examples may be parts that are to be attached to each other using a fastener.

Further, the different advantageous embodiments also recognize that information about gaps between parts is also not currently available within models. The different advantageous embodiments recognize that knowing whether changes in gaps between parts are present may be useful in determining whether to redesign the part.

The different advantageous embodiments recognize that typically, a gap may be designed between parts to account for variability of a part. The design gap for part variability may allow for another part to be placed between those parts. This part may be referred to as a shim. The different advantageous embodiments recognize that if the gap is constant, the manufacturing and placement of shims may be less time consuming and less expensive.

The different advantageous embodiments recognize that tapered gaps may require special shims and different clamp loads. The different advantageous embodiments also recognize that these types of gaps may take more time and more expense as compared to shims for consistent gaps between parts.

With the different advantageous embodiments, an identification of these types of gaps may be used to either change the gap to a consistent gap and/or eliminate the gap. This information also may be used to identify whether special shims and/or processing may be needed for particular parts.

Thus, the different advantageous embodiments provide a method, apparatus, and computer usable program code for identifying gaps. A grid of points is generated on a first surface. The grid of points is associated with a point for a first part associated with a second part in a model. A normal vector that is normal to the first surface is identified for each point in the grid of the grid of points to form a number of normal vectors normal to the first surface.

A line segment between the first surface of the first part and the second surface of the second part is formed for each of the grid of points to form a plurality of line segments. Each line segment is aligned with an associated normal vector. A gap size may then be identified between the first surface and the second surface using the plurality of line segments to form a plurality of gap measurements. In this manner, revising a model and/or other operations involving the manufacturing of an object from the model may be performed based on the gap measurements.

Figure 4:
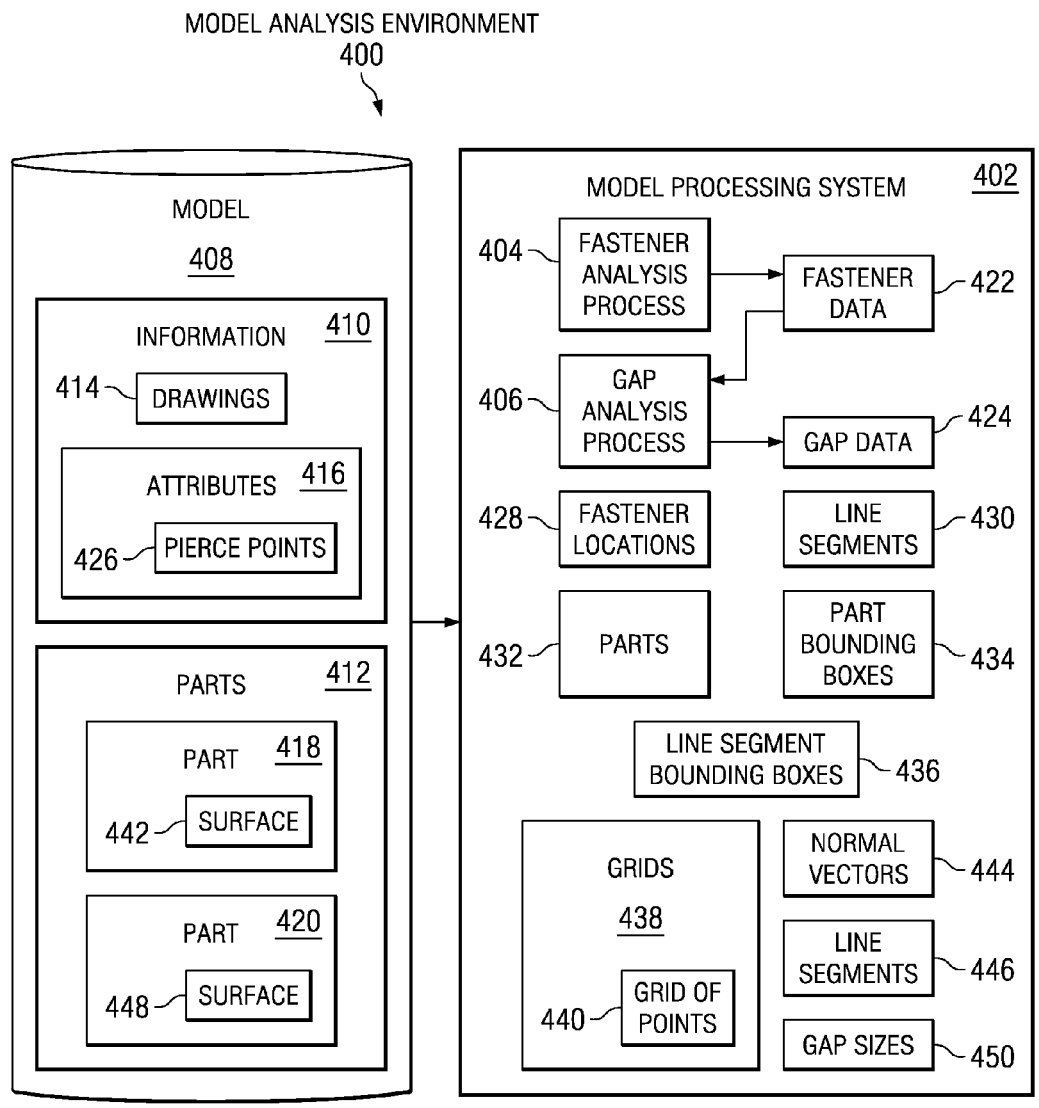
FIG. 4 is a diagram of a model analysis environment in accordance with an advantageous embodiment.

With reference now to FIG. 4, a diagram of a model analysis environment is depicted in accordance with an advantageous embodiment. In this illustrative example, model analysis environment 400 includes model processing system 402, which contains fastener analysis process 404 and gap analysis process 406. Model processing system 402 may be, for example, a data processing system such as, for example, data processing system 300 in FIG. 3.

Fastener analysis process 404 is used to identify locations for fasteners and identify parts that may be associated with fasteners. Gap analysis process 406 is used to identify gaps between parts. In these illustrative examples, fastener analysis process 404 and gap analysis process 406 use model 408 as an input.

Model 408 is an electronic file or data structure containing information 410 about parts 412. Information 410 may include, for example, drawings 414 and attributes 416. Drawings 414 may be two-dimensional and/or three-dimensional drawings for parts 412. Attributes 416 may provide information about parts 412 with respect to drawings 414.

For example, drawings 414 may contain drawings of part 418 and part 420 in parts 412. Further, attributes 416 may include information about parts 418 and 420. Attributes 416 may include, for example, an identification of part 418 and part 420. Further, attributes 416 also may include other information such as, for example, dimension information, materials, notes, and other suitable information about part 418 and part 420.

In these illustrative examples, fastener analysis process 404 generates fastener data 422. Fastener data 422 may include information about fasteners and parts associated with fasteners from model 408. For example, fastener data 422 may contain an identification of part 418 and part 420 as being associated with a fastener. In these examples, fastener data 422 is used by gap analysis process 406 to generate gap data 424. Gap data 424 includes identification of gaps between parts such as, for example, part 418 and part 420.

In operation, fastener analysis process 404 identifies fastener locations 428 within model 408. Fastener locations 428 may be locations where holes should be present to attach parts to each other. These fastener locations may be identified using pierce points 426, which may be in attributes 416. A pierce point, in these examples, is a point on a surface. In these examples, a pierce point is a point through which a hole may be started.

Fastener analysis process 404 extends a line segment through each of the fastener locations within fastener locations 428 to form line segments 430. Fastener analysis process 404 identifies parts 432 through which a line segment within line segments 430 extends. In these examples, parts 432 are either all of parts 412 or a subset of parts 412.

In the different advantageous embodiments, the comparison of line segments to parts may be performed by selecting a line segment from line segments 430 and comparing that line segment to every part within parts 412.

In some advantageous embodiments, part bounding boxes 434 for parts 412 are compared to line segment bounding boxes 436 for line segments 430. For example, an intersection of a line segment bounding box in line segment bounding boxes 436 with a number of part bounding boxes 434 may identify a number of potential parts from parts 412 that may be examined.

In this manner, other parts within parts 412 are not compared with a particular line segment. This use of bounding boxes may reduce the time needed to identify fasteners and their associations with parts.

In the different advantageous embodiments, gap analysis process 406 generates gap data 424 using fastener data 422 in these examples. Gap analysis process 406 takes fastener data 422 and generates grids 438 using an identification of parts associated with each other through fasteners in fastener data 422. In these examples, grid of points 440 is an example of a grid within grids 438. Grid of points 440 may be a grid of points on surface 442 on part 418.

Grids 438 may be generated on surfaces of parts based on pierce points that may be present in fastener data 422. If the particular pair of parts does not have a pierce point, a pierce point for that collection of parts may be extended through a vector normal for the pierce point to identify a point for a grid. Of course, any point may be selected on a surface between two parts to generate grids, in these examples.

Gap analysis process 406 identifies normal vectors 444 for each grid within grids 438. Thereafter, gap analysis process 406 generates line segments 446 for each grid of points within grids 438. Line segments 446 extend from surface 442 on part 418 to an opposing surface, such as surface 448 on part 420. The lengths of line segments 446 from surface 442 to surface 448 are used to generate gap sizes 450.

Gap sizes 450 may be used by gap analysis process 406 to generate gap data 424. For example, gap data 424 may include gap sizes 450. Additionally, gap data 424 also may include an analysis of gap sizes 450. This analysis may include, for example, whether certain gaps within gap sizes 450 exceed a tolerance level. Additionally, gap data 424 may indicate whether a tapered gap is present. Also, gap data 424 may identify whether an intersection between parts, such as part 418 and part 420, have occurred.

The direction of line segments 446 may be maintained with respect to normal vectors 444. The direction of these line segments may be used to determine whether an intersection has occurred between parts, such as part 418 and part 420.

In this manner, fastener data 422 and gap data 424 may be used to perform various operations. For example, fastener data 422 may be used to identify fasteners that may be needed to attach parts to each other when constructing an object from model 408. Fastener data 422 also may be used to create a list of fasteners needed, verify current fasteners being used, and other suitable operations. Further, fastener data 422 also may be used to revise a design of parts, depending on fasteners required to attach the parts.

Gap data 424 may be used to determine whether parts may be redesigned because of unacceptable gap sizes, shapes, or other attributes. Further, gap data 424 may be used to design shims for placement into the gaps.

The illustration of model analysis environment 400 in FIG. 4 is not meant to imply physical or architectural limitations to the manner in which different advantageous embodiments may be implemented. Other components in addition to or in place of the ones illustrated may be used. Also, in some advantageous embodiments, fewer components may be required.

In one example, fastener analysis process 404 and gap analysis process 406 may be located on different data processing systems on a network. Further, model 408 may be located remotely or as part of model processing system 402. Also, multiple models may be analyzed using the different advantageous embodiments.

Figure 5:
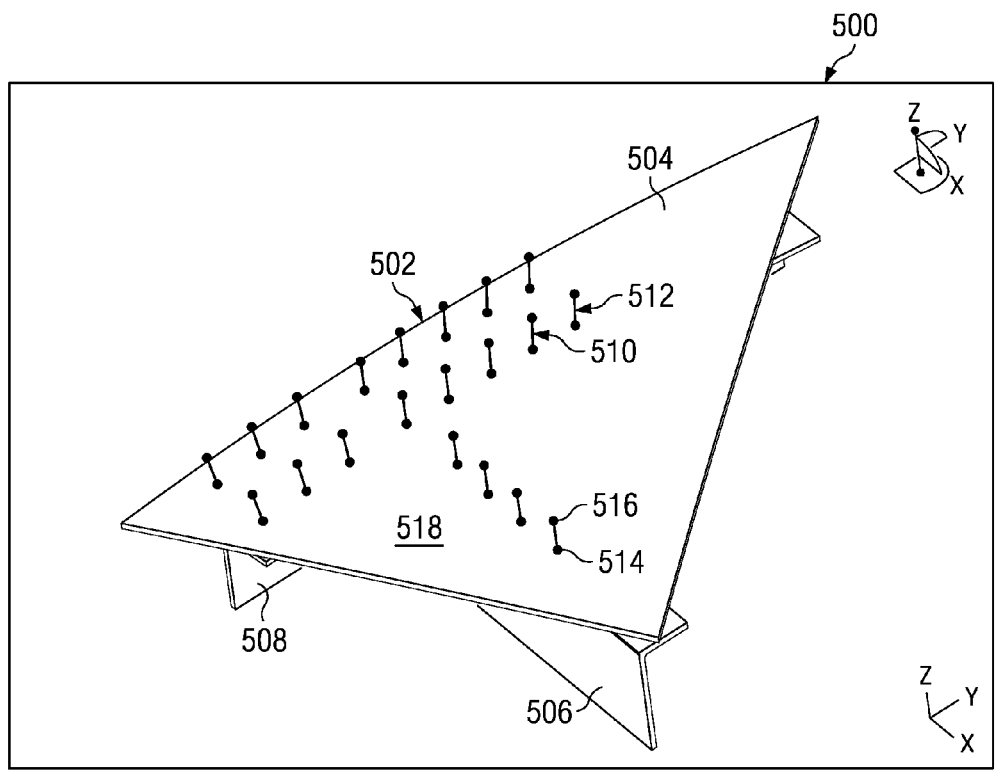
FIG. 5 is a diagram illustrating a display of a structure in a model in accordance with an advantageous embodiment.

With reference now to FIG. 5, a diagram illustrating a display of a structure in a model is depicted in accordance with an advantageous embodiment. In this example, display 500 illustrates a perspective view of structure 502. Structure 502 contains parts 504, 506, and 508. Part 504 may be a skin panel, part 506 may be an intercostal, and part 508 may be a rib.

The presentation of these parts in display 500 are examples of parts such as, for example, parts 412 in model 408 in FIG. 4. In this example, pierce points 510 with line segments 512 are illustrated. Pierce point 514 is an example of a pierce point within pierce points 510, and line segment 516 is an example of a line segment within line segments 512.

Line segments 512 are aligned with vectors that are normal to surface 518 of part 504. As can be seen in this example, pierce points 510 originate on surface 518 of part 504. Line segments 512 are normal to surface 518 in these examples. Although line segments 512 are illustrated as normal to surface 518, other advantageous embodiments may align line segments 512 with vectors that may not be normal to surface 518.

Figure 6:
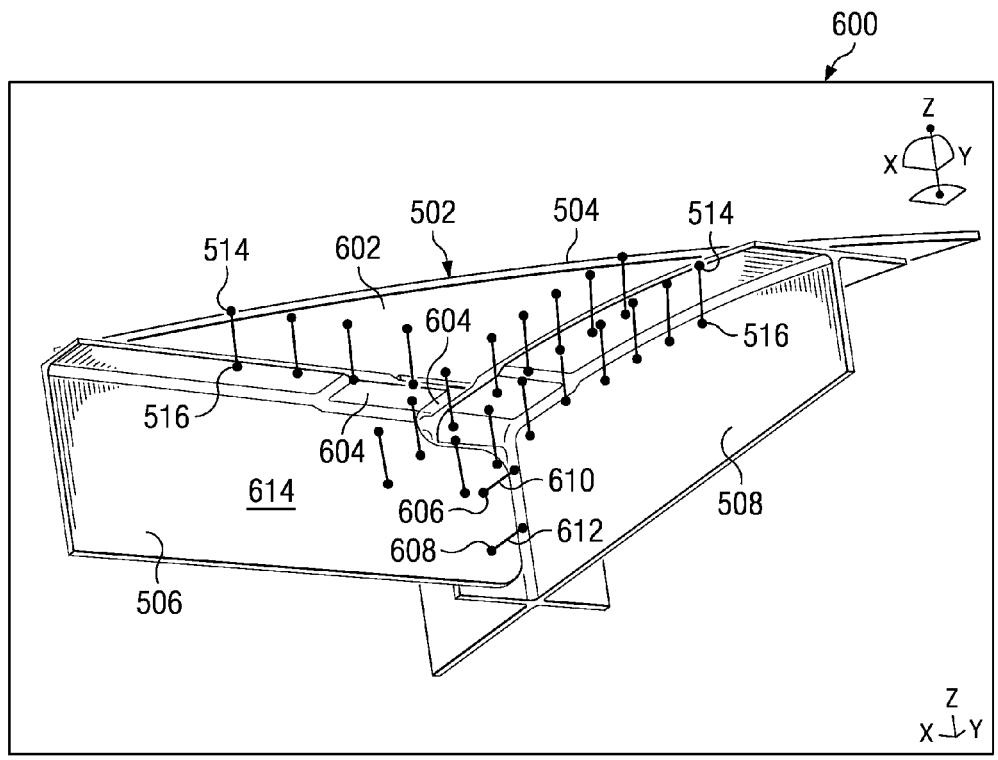
FIG. 6 is a diagram illustrating a structure in accordance with an advantageous embodiment.

With reference now to FIG. 6, a diagram illustrating a structure is depicted in accordance with an advantageous embodiment. In display 600, structure 502 is shown in a lower perspective view. In this illustrative example, part 604 also can be seen for structure 502. Part 604 is a splice plate, in this depicted example.

Further, in this view of structure 502, pierce points 606 and 608 are present on part 506. Pierce point 606 has line segment 610, while pierce point 608 has line segment 612 extending from surface 614 of part 506. Line segments 610 and 612 extend through part 506 and part 508 in these examples. As a result, these two line segments may be used to identify fasteners that are to be associated with parts 506 and 508.

In this example, line segment 516 extends through both part 504 and part 506. A comparison of line segment 516 with part 504, part 506, and part 508 identifies parts 504 and 506 as parts through which line segment 516 extends. This identification may be used to generate an association or identification of fasteners for parts 504 and 506 at pierce point 514.

In the different advantageous embodiments, each line segment is compared to every part within structure 502. This comparison is made to determine whether the line segment extends through a particular part within structure 502.

The different advantageous embodiments recognize that this type of comparison may use additional processor time and/or other computing resources to generate an identification of fasteners for parts when a large number of parts and fasteners are to be used in a structure.

In this depicted example, line segment 612 may be compared with parts 504, 506, 508, and 604. This comparison identifies parts 506 and 508 as parts through which line segment 612 extends. A similar comparison is made for every line segment in line segments 512 in FIG. 5, in these examples.

In other advantageous embodiments, other numbers of parts may be present for structure 502. For example, in some advantageous embodiments, 10 parts, 25 parts, 100 parts, 1,000 parts, or some other suitable number of parts may be present for structure 502. As the number of parts increases, the comparison of a line segment with every part in the structure may increase the time needed to identify parts for association with fasteners. The different advantageous embodiments may reduce the amount of time needed through the use of bounding boxes.

Figure 7:
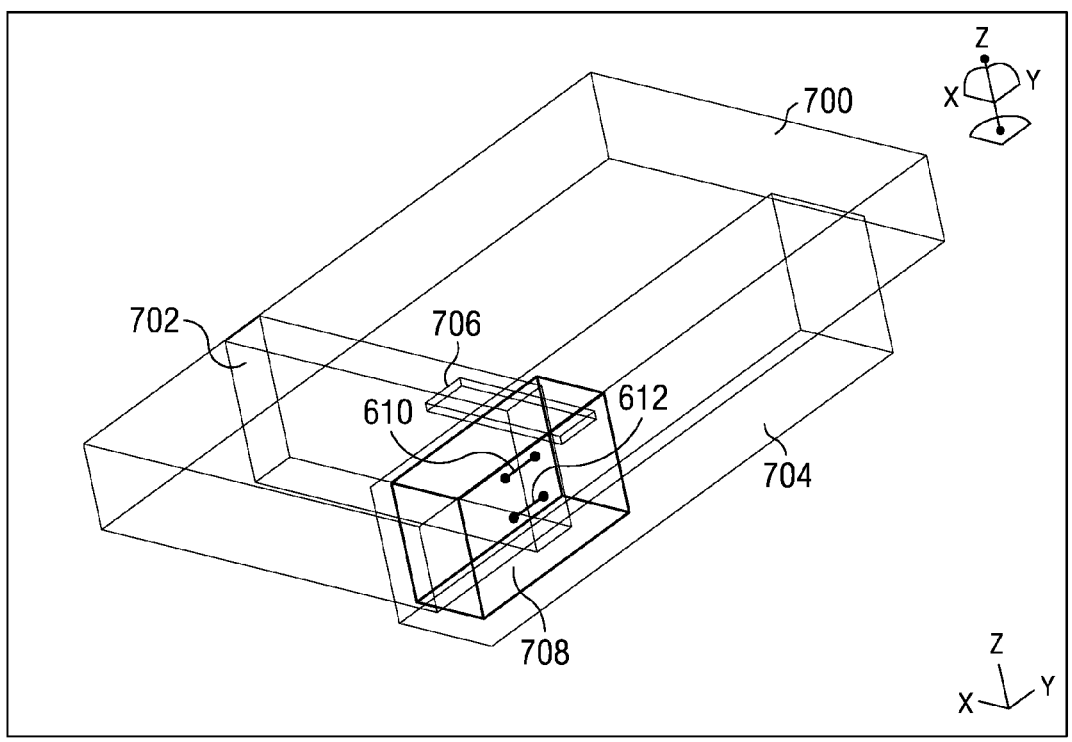
FIG. 7 is a diagram illustrating bounding boxes in accordance with an advantageous embodiment.

With reference now to FIG. 7, a diagram illustrating bounding boxes is depicted in accordance with an advantageous embodiment. Bounding boxes 700, 702, 704, and 706 are bounding boxes for parts 504, 506, 508, and 604 in FIGS. 5 and 6, respectively. These bounding boxes are typically generated for models of structures.

The different advantageous embodiments also generate bounding boxes for line segments. In this example, bounding box 708 is generated for line segments 610 and 612. In this illustrative example, bounding box 708 encompasses two line segments. Of course, bounding box 708 may be generated to encompass other numbers of line segments such as, for example, one line segment, three line segments, 10 line segments, or some other suitable number of line segments.

The intersection of bounding box 708 with bounding boxes 700, 702, and 704 identifies the associated parts as potential parts through which line segments 610 and 612 may be passed. These bounding boxes are made to identify groupings of parts for comparison to a number of line segments. In these illustrative examples, these bounding boxes correspond to parts 504, 506, 508, and 604 in FIGS. 5 and 6, respectively.

A comparison of these line segments using these bounding boxes is made to identify potential parts for analysis rather than comparing these line segments to every part in structure 502 in FIG. 5. Although only one less comparison is made in these examples, in other advantageous embodiments, when additional numbers of parts are present, the number of comparisons may be reduced by even larger numbers.

With reference now to FIG. 8, a diagram illustrating associations in a model is depicted in accordance with an advantageous embodiment. Table 800 is an example of fastener data 422 in FIG. 4. Table 800 is an example of fastener identifications and part associations that may be generated from structure 502 in FIG. 5. In this example, table 800 illustrates associations between fasteners and parts.

Table 800 includes identification of fasteners in column 802. Parts may be identified in columns 804, 806, and 808. An identification of surfaces for the parts is located in column 810. The identification of surfaces in column 810 is a location on a surface where a line segment intersected the surface of the part. The information in table 800 may be used to identify and analyze gaps in structure 502 in FIG. 5, in these examples.

Figure 9:
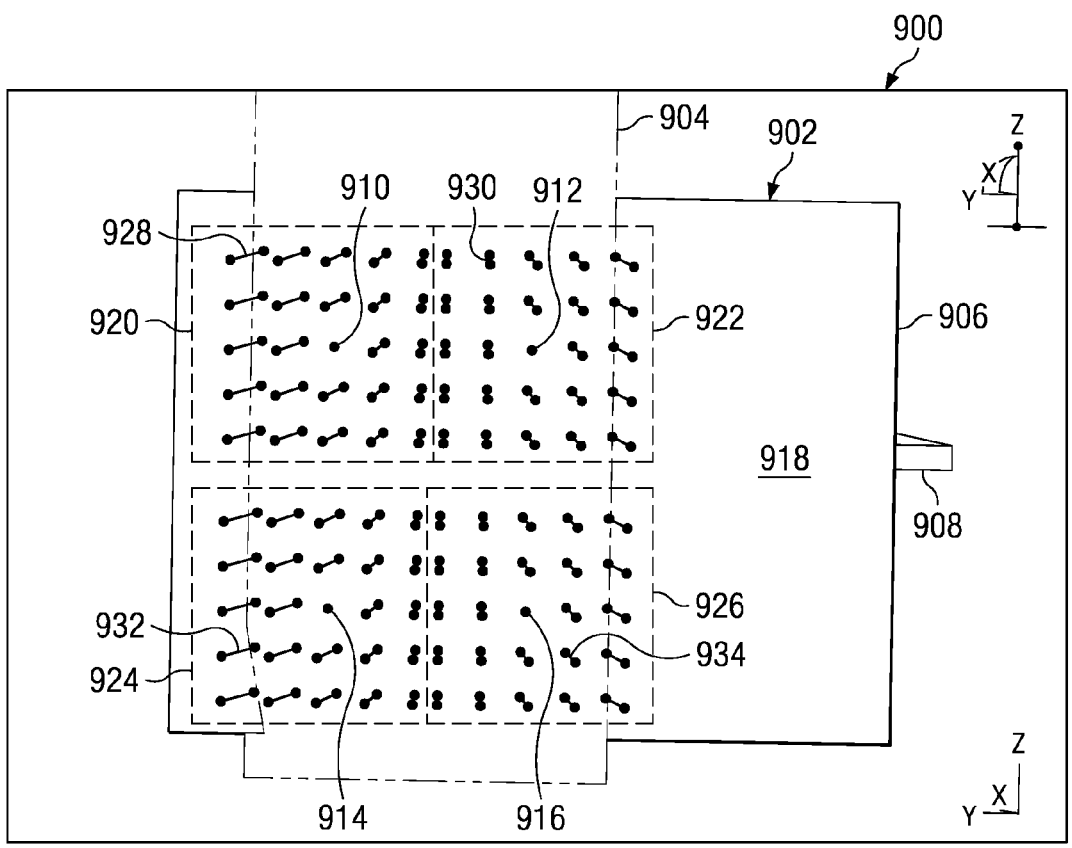
FIG. 9 is a diagram of a display of a part in accordance with an advantageous embodiment.

With reference now to FIG. 9, a diagram of a display of a part is depicted in accordance with an advantageous embodiment. In this example, display 900 is a top view of structure 902. Structure 902 contains parts 904, 906, and 908.

Pierce points 910, 912, 914, and 916 are present on surface 918 of part 906. Grids of points 920, 922, 924, and 926 are formed relative to pierce points 910, 912, 914, and 916, respectively.

In this example, grids of points 920, 922, 924, and 926 are constructed around pierce points 910, 912, 914, and 916. In these examples, the points in a grid of points may be symmetrically spaced around a pierce point. The spacing of points around pierce points 910, 912, 914, and 916 may be spaced in a number of different ways.

In these examples, a grid of points is selected to have an area that is square in shape and four times the fastener diameter on each side. Of course, other types of selections may be made. For example, if fasteners have not yet been added to the model, a quarter inch spacing on a four by four grid may be used.

In this illustrative example, line segments 928 extend from surface 918 located on pierce point 910. Line segments 930 extend from surface 918 located on pierce point 912. Line segments 932 extend from surface 918 located on pierce point 914. Line segments 934 extend from surface 918 located on pierce point 916. These line segments extend in a direction that is normal to surface 918 towards part 904, which is shown in phantom in this example, to illustrate the extension of line segments.

Figure 10:
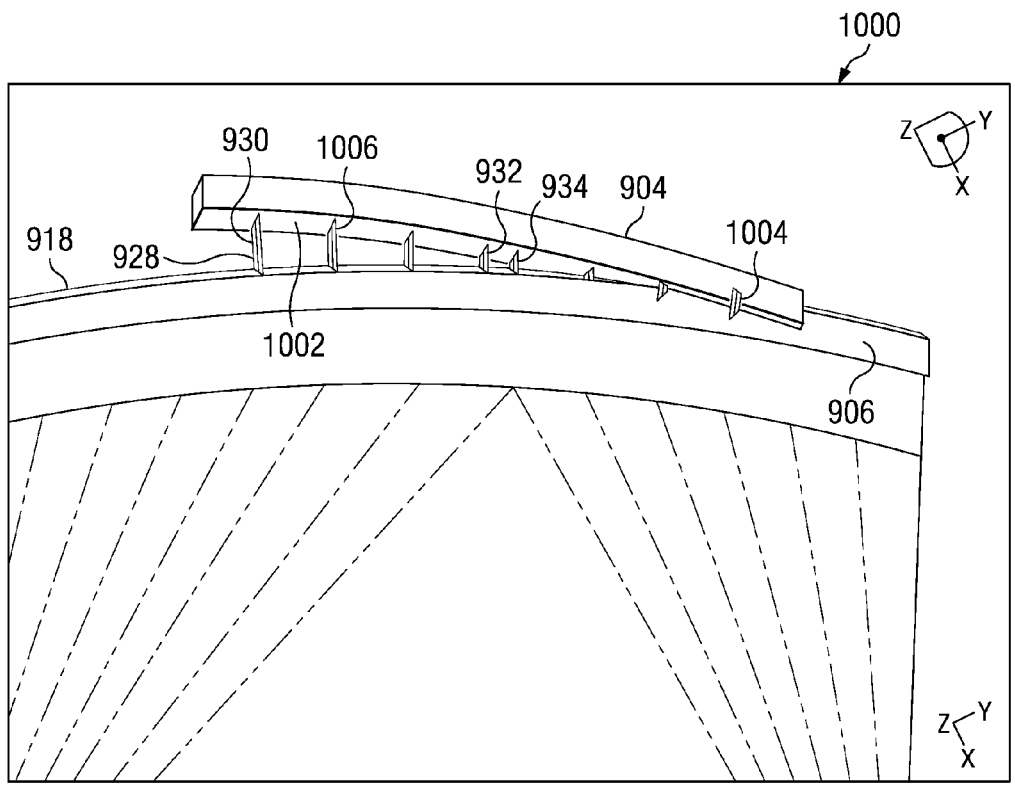
FIG. 10 is a diagram illustrating line segments extending between surfaces of two parts in accordance with an advantageous embodiment.

With reference now to FIG. 10, a diagram illustrating line segments extending between surfaces of two parts is depicted in accordance with an advantageous embodiment. In this example, display 1000 provides a side view of parts 904 and 906.

In this depicted example, line segments 928, 930, 932, and 934 extend from surface 918 of part 906 to surface 1002 of part 904. As can be seen in this depicted example, some line segments, such as line segment 1004, extend from surface 918 to surface 1002 in a direction that is opposite from line segment 1006.

This change in direction may be identified using direction vectors or positive and negative values to identify intersections between parts such as, for example, part 904 and part 906. In this example, segment 1004 may have a negative value to indicate an intersection, while segment 1006 may have a positive value.

As can be seen, surface normals are generated for each point, and the normals are used to find intersecting points on opposing surfaces for an opposing part. The length of the segments may be used to identify gaps that may be present.

Figures 11, 12:
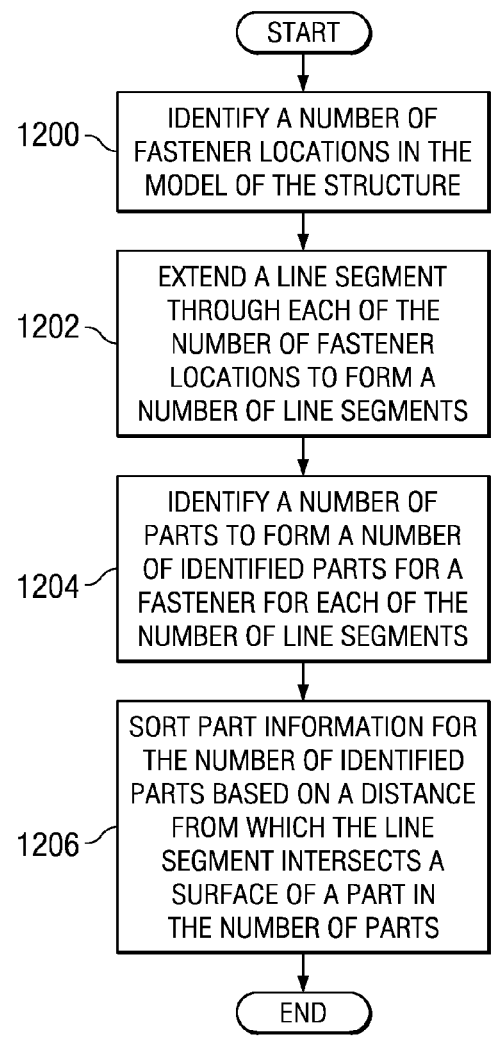
FIG. 11 is an illustration of a table of gap information in accordance with an advantageous embodiment.
FIG. 12 is a flowchart of a process for identifying associations in a model of a structure in accordance with an advantageous embodiment.

With reference now to FIG. 11, an illustration of a table of gap information is depicted in accordance with an advantageous embodiment. Table 1100 is an example of one form for gap data 424 in FIG. 4.

In this example, table 1100 contains locations in column 1102, and gap information in columns 1104 and 1106. In these examples, an entry of NI in column 1104 indicates that no intersection has occurred. The values in column 1104 also take into account the direction which may be identified by positive and negative values. The values in column 1106 are magnitudes and do not contain directional information.

Additionally, table 1100 includes range information in row 1108. Median values are shown in row 1110 in this example. Of course, in other advantageous embodiments, other types of information may be included, depending on the particular implementation. For example, an identification of a location with gaps that exceed a range limit may be identified.

Further, in addition to using a table such as, for example, table 1100, the gap data may take other forms. For example, a display may illustrate the pierce points with colors for different gap lengths. Alternatively, the gap lengths may be identified using a contoured map or some other suitable form of presentation.

With reference now to FIG. 12, a flowchart of a process for identifying associations in a model of a structure is depicted in accordance with an advantageous embodiment. The process illustrated in FIG. 12 may be implemented in a software component such as, for example, fastener analysis process 404 in FIG. 4.

The process begins by identifying a number of fastener locations in the model of the structure (operation 1200). In these examples, the fastener locations may be identified through pierce points and/or holes that may be present in the model of a structure.

A line segment is extended through each of the number of fastener locations to form a number of line segments (operation 1202). Each line segment extends a selected distance outside of an associated fastener location in the number of fastener locations. The selected distance may vary.

For example, the line segment may extend in a direction normal to the surface on which a fastener location is present. The line segment may extend in each direction from the surface for a distance that may be based on the fastener.

The process then identifies a number of parts through which the line segment extends to form a number of identified parts for a fastener for each of the number of line segments (operation 1204). The process may then sort part information for the number of identified parts based on a distance from which the line segment intersects a surface of a part in the number of parts (operation 1206), with the process terminating thereafter. In operation 1206, each part may be identified based on its location relative to when the part is pierced or intersected by the line segment extending from the surface of the fastener location.

Of course, in some advantageous embodiments, if the line segment only extends or pierces one surface of a part, the line segment may be extended in length to pierce or extend through the other surface of the part. The line segment may also be reduced in length to not extend through the part at all.

Figure 13:
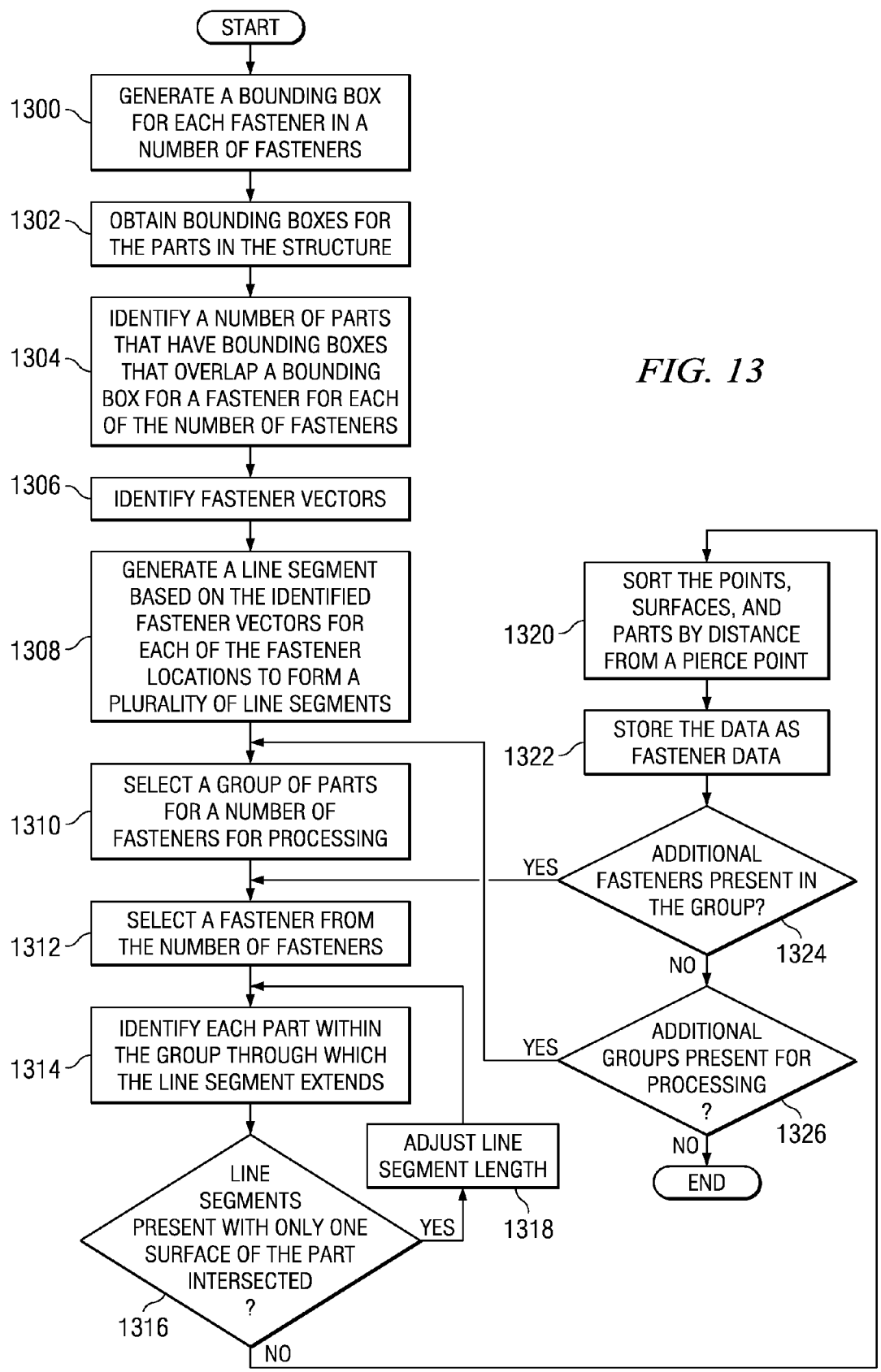
FIG. 13 is a flowchart of a process for deriving associations between fasteners and parts in accordance with an advantageous embodiment.

With reference now to FIG. 13, a flowchart of a process for deriving associations between fasteners and parts is depicted in accordance with an advantageous embodiment. The process illustrated in FIG. 13 is an example of a process that may be implemented in a software component such as, for example, fastener analysis process 404 in FIG. 4.

The process begins by generating a bounding box for each fastener in a number of fasteners (operation 1300). Thereafter, bounding boxes are obtained for the parts in the structure (operation 1302). The process then identifies a number of parts that have bounding boxes that overlap a bounding box for a fastener for each of the number of fasteners (operation 1304).

The process then identifies fastener vectors (operation 1306). In these examples, the fastener vectors are vectors that are normal to the surface of the part on which a fastener location is present. The fastener vectors may, in some cases, not be normal to the outer surface.

The process generates a line segment based on the identified fastener vectors for each of the fastener locations to form a plurality of line segments (operation 1308). The process then selects a group of parts for a number of fasteners for processing (operation 1310). The process then selects a fastener from the number of fasteners (operation 1312). In some advantageous embodiments, a bounding box may contain more than one fastener.

The process then identifies each part within the group through which the line segment extends (operation 1314). In some advantageous embodiments, a line segment may be considered to extend through a part only if the line segment extends through both surfaces of a part. If only one surface of a part is intersected by the line segment, this line segment may be saved for later processing. A determination is made as to whether any line segments are present in which only one surface of the part has been intersected (operation 1316).

If line segments are present in which only one surface has been intersected, the process adjusts the line segment length for these line segments (operation 1318). This operation may identify line segments that may have only intersected a portion of a part. The line segment length may be adjusted to determine whether a different fastener may be needed, if a redesign may occur, and/or some other suitable action may be taken. The process then returns to operation 1314, as described above.

With reference again to operation 1316, if line segments are not present in which only one surface has been intersected, the process sorts the points, surfaces, and parts by distance from a pierce point (operation 1320). The process then stores the data as fastener data (operation 1322).

The process determines whether additional fasteners are present in the group (operation 1324). If additional fasteners are present, the process returns to operation 1312. Otherwise, a determination is made as to whether additional groups are present for processing (operation 1326). If additional groups are present for processing, the process returns to operation 1310. If no additional groups are present for processing, the process terminates.

Figure 14:
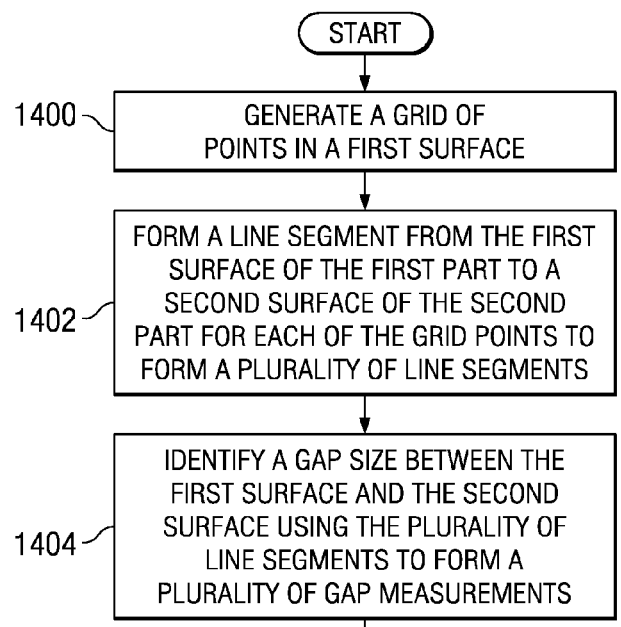
FIG. 14 is a flowchart of a process for identifying gaps in accordance with an advantageous embodiment.

With reference now to FIG. 14, a flowchart of a process for identifying gaps is depicted in accordance with an advantageous embodiment. The process illustrated in FIG. 14 may be implemented in a software component such as, for example, gap analysis process 406 in FIG. 4.

The process begins by generating a grid of points in a first surface (operation 1400). The grid of points is associated with a point for a first part associated with a second part in a model.

The process then forms a line segment from the first surface of the first part to a second surface of the second part for each of the grid points to form a plurality of line segments (operation 1402). Each line segment in the plurality of line segments is aligned with an associated normal vector for the surface. The process then identifies a gap size between the first surface and the second surface using the plurality of line segments to form a plurality of gap measurements (operation 1404), with the process terminating thereafter.

Figure 15:
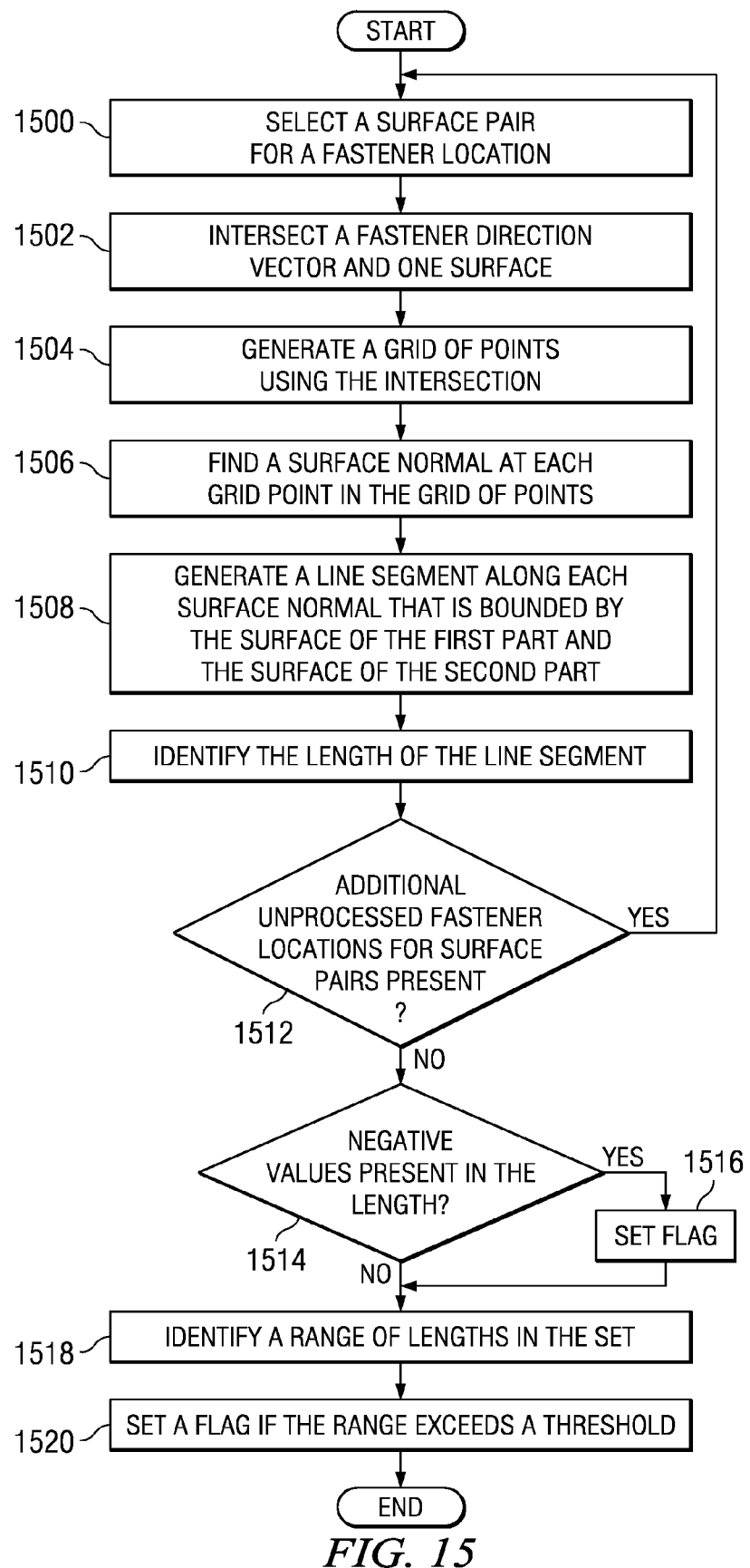
FIG. 15 is a flowchart of a process for identifying gap information in accordance with an advantageous embodiment.

With reference now to FIG. 15, a flowchart of a process for identifying gap information is depicted in accordance with an advantageous embodiment. The process illustrated in FIG. 15 may be implemented in a software process such as, for example, gap analysis process 406 to generate gap data 424 in FIG. 4.

The process begins by selecting a surface pair for a fastener location (operation 1500). The process then intersects a fastener direction vector and one surface (operation 1502). In operation 1502, the fastener direction vector is a vector that may extend in a direction normal to a surface at the location of a pierce point.

In some advantageous embodiments, the vector may extend in a direction that is not normal to the surface at the location of the pierce point. If the pierce point is on a surface other than the surfaces of interest between two parts, the fastener direction vector may be used to identify the point on the surface of interest. If the pierce point is located on the surface of interest, this operation may be omitted.

A grid of points is generated using the intersection (operation 1504). The process then finds a surface normal at each grid point in the grid of points (operation 1506).

Next, the process generates a line segment along each surface normal that is bounded by the surface of the first part and the surface of the second part (operation 1508). In other words, the line segment extends from one surface to another surface. The process then identifies the length of the line segment (operation 1510). This length may be negative if the parts intersect each other. A determination is then made as to whether additional unprocessed fastener locations for surface pairs are present (operation 1512). If additional fastener locations are present, the process returns to operation 1500.

Otherwise, a determination is made as to whether negative values are present in the length (operation 1514). If negative values are present, a flag is set (operation 1516). Otherwise, the process identifies a range of lengths in the set (operation 1518). The process also proceeds to operation 1518 from operation 1516. The range of lengths may be performed for a single grid if multiple fasteners are present that may be located within a grid.

In other words, if two fasteners have overlapping grids, operation 1518 may be performed only for a single grid or for both grids, depending on the particular implementation. The process then sets a flag if the range exceeds a threshold (operation 1520), with the process terminating thereafter.

Figure 16:
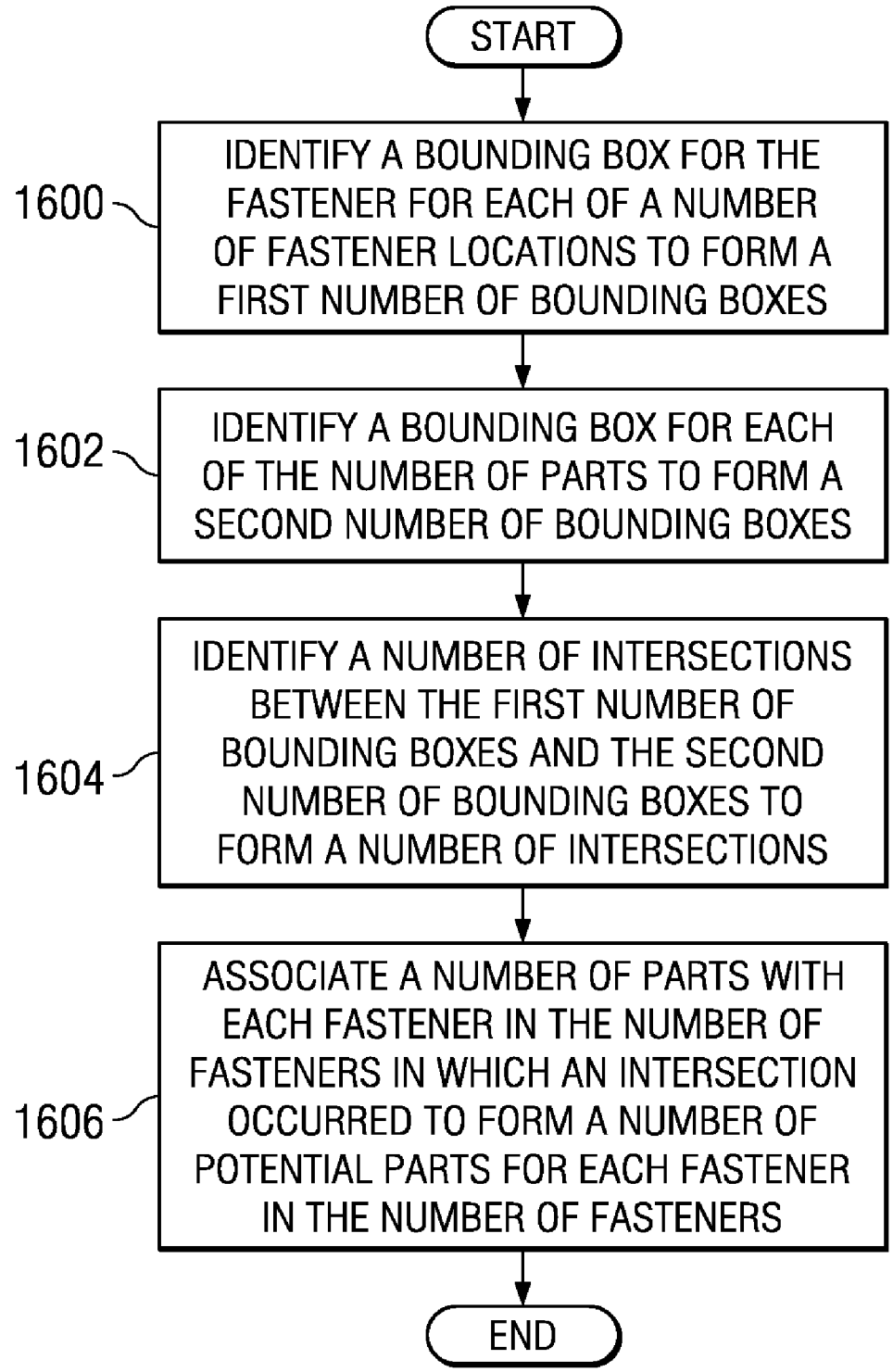
FIG. 16 is a flowchart of a process for associating potential parts with fastener locations in accordance with an advantageous embodiment.

With reference now to FIG. 16, a flowchart of a process for associating potential parts with fastener locations is depicted in accordance with an advantageous embodiment. The process illustrated in FIG. 16 may be implemented in a software component, such as fastener analysis process 404 in FIG. 4.

The process begins by identifying a bounding box for the fastener for each of a number of fastener locations to form a first number of bounding boxes (operation 1600). The bounding boxes may have a shape based on a fastener that may be used at the fastener location. A bounding box may be identified for each of the number of parts to form a second number of bounding boxes (operation 1602).

A number of intersections between the first number of bounding boxes and the second number of bounding boxes is identified to form a number of intersections (operation 1604). A number of parts may then be associated with each fastener in the number of fasteners in which an intersection occurred to form a number of potential parts for each fastener in the number of fasteners (operation 1606), with the process terminating thereafter. In this manner, a smaller number of parts may be compared with line segments for a fastener location based on intersections of bounding boxes for the parts with a bounding box for a fastener location.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions.

In some alternative implementations, the function or functions noted in the blocks may occur out of the order noted in the figures. For example, in some cases, two blocks shown in succession may be executed substantially concurrently, or the blocks may sometimes be executed in the reverse order, depending upon the functionality involved.

Thus, the different advantageous embodiments provide a method, apparatus, and computer program code for identifying associations and gap data. These associations are parts that are associated with fasteners or locations for fasteners in these examples.

The associations may be identified by identifying a number of fastener locations in the model of the structure. A line segment may be extended through each of the fastener locations to form a number of line segments in which the line segment extends a selected distance away from the associated fastener location in the number of fastener locations. A number of parts is identified through which the line segment extends to form a number of identified parts for a fastener for each of the number of line segments.

The gap data may be identified by generating a grid of points on a first surface in which the grid of points is associated with a point for a first part associated with a second part in a model. A line segment is formed from the first surface of the first part to the second surface of the second part for each of the grid parts to form a plurality of line segments in which each line segment in the plurality of line segments is aligned with an associated normal vector. A gap size is identified between the first surface and the second surface using the plurality of line segments to form a plurality of gap measurements.

With this information, changes to designs, selection of fasteners, designs for shims, generation of instructions to assemble parts, and other suitable operations may be performed. Using the different advantageous embodiments, the identification of the information may be performed with less time and effort. In some cases, the identification of the information may be too time consuming to perform depending on the complexity of the structure.

The different advantageous embodiments can take the form of an entirely hardware embodiment, an entirely software embodiment, or an embodiment containing both hardware and software elements. Some embodiments are implemented in software, which includes, but is not limited to, forms such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation, an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example, without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters and are just a few of the currently available types of communications adapters.

The description of the different advantageous embodiments has been presented for purposes of illustration and description, and it is not intended to be exhaustive or limited to the embodiments in the form disclosed. Many modifications and variations will be apparent to those of ordinary skill in the art. Further, different advantageous embodiments may provide different advantages as compared to other advantageous embodiments.

The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A computer implemented method for identifying associations in a model of a structure, the method comprising:
    identifying in a processor, a number of fastener locations in the model of the structure;
    extending in the processor, a line segment through each of the number of fastener locations to form a number of line segments, wherein the line segment extends a selected distance away from an associated fastener location in the number of fastener locations; and
    identifying in the processor a number of parts through which the line segment extends to form a number of identified parts for a fastener for each of the number of line segments.

2. The method of claim 1, wherein the step of identifying the number of fastener locations in the model of the structure comprises:
    identifying a number of hole locations in the model of the structure.

3. The method of claim 2, wherein the step of identifying the number of hole locations in the model of the structure comprises:
    identifying a number of pierce points, wherein each pierce point in the number of pierce points is associated with a hole location in the number of hole locations.

4. The method of claim 1, wherein the step of identifying the number of parts through which the line segment extends to form the number of identified parts for the fastener for the each of the number of line segments comprises:
  identifying part information for each of the number of parts through which the line segment extends to form the number of identified parts for the fastener for the each of the number of line segments.

5. The method of claim 4, wherein the step of identifying the number of parts through which the line segment extends to form the number of identified parts for the fastener for the each of the number of line segments further comprises:
  sorting the part information based on a distance from which the line segment intersects a surface of a part in the number of parts.

6. The method of claim 4, wherein the part information comprises at least one of a part identifier, a point location, and a number of surface identifiers.

7. The method of claim 1, wherein the step of identifying the number of parts through which the line segment extends to form the number of identified parts for the fastener for the each of the number of line segments comprises:
  identifying a bounding box for a fastener location for each of the number of fastener locations to form a first number of bounding boxes;
  identifying a bounding box for each of the number of parts to form a second number of bounding boxes;
  identifying a number of intersections between the first number of bounding boxes and the second number of bounding boxes to form the number of intersections;
  associating the number of parts with each fastener location in the number of fastener locations in which an intersection occurred to form a number of potential parts for the each fastener location in the number of fastener locations; and
  identifying each of the number of potential parts intersected by the line segment for each of the number of line segments.

8. The method of claim 1, wherein the number of fastener locations is a number of pierce points and wherein the extending step comprises:
  extending the line segment through a pierce point in each of the number of pierce points, wherein the line segment has a length;
  determining whether the line segment extends through only one surface of a part; and
  responsive to the line segment only extending through one surface of the part, changing a length of the line segment.

9. The method of claim 1, wherein the selected distance of the line segment is derived from a length of a fastener.

10. A data processing system comprising:
  a bus;
  a communications unit connected to the bus;
  a storage device connected to the bus, wherein the storage device includes program code; and
  a processor unit connected to the bus, wherein the processor unit executes the program code to identify a number of fastener locations in a model of a structure;
  extend a line segment through each of the number of fastener locations to form a number of line segments, wherein the line segment extends a selected distance away from an associated fastener location in the number of fastener locations; and
  identify a number of parts through which the line segment extends to form a number of identified parts for a fastener for each of the number of line segments.

11. The data processing system of claim 10, wherein in executing the program code to identify the number of fastener locations in the model of the structure, the processor unit executes the program code to identify a number of hole locations in the model of the structure.

12. The data processing system of claim 11, wherein in executing the program code to identify the number of hole locations in the model of the structure, the processor unit executes the program code to identify a number of pierce points, wherein each pierce point in the number of pierce points is associated with a hole location in the number of hole locations.

13. The data processing system of claim 10, wherein in executing the program code to identify the number of parts through which the line segment extends to form the number of identified parts for the fastener for the each of the number of line segments the processor unit executes the program code to identify part information for each of the number of parts through which the line segment extends to form the number of identified parts for the fastener for the each of the number of line segments.

14. The data processing system of claim 13, wherein in executing the program code to identify the number of parts through which the line segment extends to form the number of identified parts for the fastener for the each of the number of line segments the processor unit further executes the program code to sort the part information based on a distance from which the line segment intersects a surface of a part in the number of parts.

15. The data processing system of claim 13, wherein the part information comprises at least one of a part identifier, a point location, and a number of surface identifiers.

16. The data processing system of claim 10, wherein in executing the program code to identify the number of parts through which the line segment extends to form the number of identified parts for the fastener for the each of the number of line segments the processor unit executes the program code to identify a bounding box for a fastener location for each of the number of fastener locations to form a first number of bounding boxes;
  identify a bounding box for each of the number of parts to form a second number of bounding boxes;
  identify a number of intersections between the first number of bounding boxes and the second number of bounding boxes to form the number of intersections;
  associate the number of parts with each fastener location in the number of fastener locations in which an intersection occurred to form a number of potential parts for the each fastener location in the number of fastener locations; and
  identifying each of the number of potential parts intersected by the line segment for each of the number of line segments.

17. A computer program product for identifying associations in a model of a structure, the computer program product comprising:
  a non-transitory computer recordable storage medium storing computer executable instructions that when executed by a processor perform a process, the medium comprising:
  instructions for identifying a number of fastener locations in the model of the structure;
  instructions for extending a line segment through each of the number of fastener locations to form a number of line segments, wherein the line segment extends a selected distance away from an associated fastener location in the number of fastener locations; and
  instructions for identifying a number of parts through which the line segment extends to form a number of identified parts for a fastener for each of the number of line segments.

18. The computer program product of claim 17, wherein the instructions for identifying the number of fastener locations in the model of the structure comprises:

instructions for identifying a number of hole locations in the model of the structure.

19. The computer program product of claim 18, wherein the instructions for identifying the number of hole locations in the model of the structure comprises:

instructions for identifying a number of pierce points, wherein each pierce point in the number of pierce points is associated with a hole location in the number of hole locations.

20. The computer program product of claim 17, wherein the instructions for identifying the number of parts through which the line segment extends to form the number of identified parts for the fastener for the each of the number of line segments comprises:

instructions for identifying part information for each of the number of parts through which the line segment extends to form the number of identified parts for the fastener for the each of the number of line segments.

21. The computer program product of claim 20, wherein the instructions for identifying the number of parts through which the line segment extends to form the number of identified parts for the fastener for the each of the number of line segments further comprises:

instructions for sorting the part information based on a distance from which the line segment intersects a surface of a part in the number of parts.

22. The computer program product of claim 20, wherein the part information comprises at least one of a part identifier, a point location, and a number of surface identifiers.

* * * * *